(12) United States Patent
Kim

(10) Patent No.: US 10,734,420 B2
(45) Date of Patent: Aug. 4, 2020

(54) IMAGE SENSOR HAVING AN N-TYPE PHOTODIODE AND A P-TYPE PHOTODIODE

(71) Applicant: SK hynix Inc., Icheon-si (KR)

(72) Inventor: Sung-Man Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/002,489

(22) Filed: Jun. 7, 2018

(65) Prior Publication Data

US 2019/0131326 A1 May 2, 2019

(30) Foreign Application Priority Data

Oct. 27, 2017 (KR) .......................... 10-2017-0141280

(51) Int. Cl.
*H01L 27/146* (2006.01)
*H04N 5/376* (2011.01)
*H04N 5/378* (2011.01)

(52) U.S. Cl.
CPC .... *H01L 27/1461* (2013.01); *H01L 27/14603* (2013.01); *H01L 27/14641* (2013.01); *H01L 27/14689* (2013.01); *H01L 27/1463* (2013.01); *H01L 27/14612* (2013.01); *H01L 27/14645* (2013.01); *H01L 27/14654* (2013.01); *H04N 5/378* (2013.01); *H04N 5/3765* (2013.01)

(58) Field of Classification Search
CPC .......... H01L 27/1461; H01L 27/14689; H01L 27/14641; H01L 27/1463; H01L 27/14612; H01L 27/14654; H01L 27/14645; H01L 27/14603–14616; H04N 5/3765; H04N 5/378
See application file for complete search history.

(56) References Cited

U.S. PATENT DOCUMENTS

| 7,728,277 B2 | 6/2010 | Stevens et al. | |
| 2013/0153748 A1* | 6/2013 | Suzuki | H01L 27/14607 250/208.1 |
| 2017/0212221 A1* | 7/2017 | Goden | G01S 17/10 |
| 2017/0213859 A1* | 7/2017 | Ota | H01L 27/1443 |

* cited by examiner

*Primary Examiner* — Nelson Garces
(74) *Attorney, Agent, or Firm* — Perkins Coie LLP

(57) ABSTRACT

An image sensor is provided. The image sensor may include first to fourth unit pixels. The first unit pixel includes a first photodiode, a first transfer gate, and a first floating diffusion region, and the second unit pixel includes a second photodiode, a second transfer gate, and a second floating diffusion region, and the third unit pixel includes a third photodiode, a third transfer gate, and a third floating diffusion region, and the fourth unit pixel includes a fourth photodiode, a fourth transfer gate, and a fourth floating diffusion region. The first photodiode and the third photodiode may be N-type photodiodes. The second photodiode and the fourth photodiode may be P-type photodiodes.

16 Claims, 12 Drawing Sheets

IMAGE SENSOR HAVING AN N-TYPE PHOTODIODE AND A P-TYPE PHOTODIODE

CROSS-REFERENCE TO RELATED APPLICATIONS

This patent document claims the priority to and benefits of Korean Patent Application number 10-2017-0141280 filed on Oct. 27, 2017, which is incorporated herein by reference in its entirety.

TECHNICAL FIELD

The technology and implementations disclosed in this patent document generally relate to an image sensor, and more particularly to an image sensor having both of an N-type photodiode and a P-type photodiode to use electrons and holes.

BACKGROUND

Recently, with the development of information and communication technologies and the digitalization of image information, an increasing number of electrical devices, such as a digital camera, a camcorder, a mobile phone, a personal communication system (PCS), a game machine, a security camera, and a medical micro-camera, are now equipped with image sensors. In general, an image sensor includes, among other things, a pixel region including pixels having photosensing elements such as photodiodes and a peripheral circuit region coupled to the pixel region. A unit pixel includes a photosensing element such as a photodiode that converts received light at the unit pixel into charges and a charge transfer transistor. The charge transfer transistor may be disposed between the photodiode and a floating diffusion region to transmit charges generated by the photodiode to the floating diffusion region.

SUMMARY

This patent document provides, among others, designs of image sensors that include both N-type photodiodes and P-type photodiodes to use electrons and holes, respectively, as charge carriers.

In an embodiment of the disclosed technology, an image sensor may include a first unit pixel including a first photodiode, a first transfer gate, and a first floating diffusion region; a second unit pixel including a second photodiode, a second transfer gate, and a second floating diffusion region; a third unit pixel including a third photodiode, a third transfer gate, and a third floating diffusion region; and a fourth unit pixel including a fourth photodiode, a fourth transfer gate, and a fourth floating diffusion region.

The first photodiode and the third photodiode may be N-type photodiodes.

The second photodiode and the fourth photodiode may be P-type photodiodes.

The first, second, third and fourth unit pixels are spatially arranged so that at least two adjacent photodiodes are different types.

The first to fourth unit pixels may be arranged in first to fourth quadrants, respectively.

The first unit pixel and the third unit pixel may be arranged in a first diagonal direction.

The second unit pixel and the fourth unit pixel may be arranged in a second diagonal direction crossing the first diagonal direction.

The first to fourth transfer gates and the first to fourth floating diffusion regions may be disposed to face to a center portion of the pixel block.

The first transfer gate and the third transfer gate may be N-type conductors.

The second transfer gate and the fourth gate may be P-type conductors.

The first floating diffusion region and the third floating diffusion region may be N-type doped regions.

The second floating diffusion region and the fourth diffusion may be P-type doped regions.

The first photodiode may include a first doped bulk region and a first doped surface region.

The second photodiode may include a second doped bulk region and a second doped surface region.

The third photodiode may be a third doped bulk region and a third doped surface region.

The fourth photodiode may be a fourth doped bulk region and a fourth doped surface region.

The first doped bulk region and the third doped bulk region may be N-type doped regions.

The second doped bulk region and the fourth doped bulk region may be P-type regions.

The first doped surface region and the third doped surface region may be P-type doped regions.

The second doped surface region and the fourth doped surface region may be N-type doped regions.

The first floating diffusion region and the third floating diffusion region may be electrically connected to each other.

The second floating diffusion region and the fourth floating diffusion region may be electrically connected to each other.

The pixel block may further include an N-type driving transistor, an N-type selecting transistor, and an N-type reset transistor electrically connected to the first floating diffusion region and the third floating diffusion region, and a P-type driving transistor, a P-type selecting transistor, and a P-type reset transistor electrically connected to the second floating diffusion region and the fourth floating diffusion region.

The pixel block may further include a P-type driving active region having the N-type driving transistor and the N-type selecting transistor formed therein, a P-type reset active region having the N-type reset transistor formed therein, an N-type driving active region having the P-type driving transistor and the P-type selecting transistor formed therein, and an N-type reset active region having the P-type reset transistor formed therein.

In an embodiment, an image sensor may include a P-type substrate; an N-well region formed in the P-type substrate; a first N-type photodiode including a first N-type doped bulk region formed in the P-type substrate and a first P-type doped surface region on the first bulk doped region; a first P-type photodiode including a first P-type doped bulk region formed in the N-well region and a first N-type doped surface region on the first P-type bulk doped region, a first N-type transfer gate electrically connected to the first N-type photodiode and a first N-type floating diffusion region, and a first P-type transfer gate electrically connected to the first P-type photodiode and a first P-type floating diffusion region.

The first N-type floating diffusion region and the first P-type floating diffusion region may be disposed relatively closer than the first N-type transfer gate and the first P-type transfer gate.

The image sensor may further include a second N-type photodiode including a second doped bulk region formed in the P-type substrate and a second P-type doped surface region on the second N-type bulk doped region, a second P-type photodiode including a second doped bulk region formed in the N-well region in the substrate and a second N-type doped surface region on the second P-type bulk doped region, a second N-type transfer gate electrically connected to the second N-type photodiode and a second N-type floating diffusion region, and a second P-type transfer gate electrically connected to the second P-type photodiode formed in the N-well region and a second P-type floating diffusion region.

The image sensor may further include an N-type active region; and a P-type driving transistor, a P-type selecting transistor, and a P-type reset transistor on the N-type active region.

The N-type active region may be an N-type doped region.

The P-type driving transistor, the P-type selecting transistor, and the P-type reset transistor may have P-type gate electrodes.

The image sensor may further include a P-type active region, and an N-type driving transistor, an N-type selecting transistor, and an N-type reset transistor on the P-type active region.

The P-type active region may be a P-type doped region.

The N-type driving transistor, the N-type selecting transistor, and the N-type reset transistor may have N-type gate electrodes.

The P-type active region, the N-type driving transistor, the N-type selecting transistor, and the N-type reset transistor may be electrically connected to the first N-type floating diffusion region.

The N-type active region, the P-type driving transistor, the P-type selecting transistor, and the P-type reset transistor may be electrically connected to the first P-type floating diffusion region.

In an embodiment, an image sensor may include a pixel block including an N-type pixel circuit and a P-type pixel circuit.

The N-type pixel circuit may include a first N-type photodiode and a second N-type photodiode, a first N-type transfer transistor and a second N-type transfer transistor, a first N-type floating diffusion region and a second N-type floating diffusion region, and an N-type transistor group.

The P-type pixel circuit may include a first P-type photodiode and a second P-type photodiode, a first P-type transfer transistor and a second P-type transfer transistor, a first P-type floating diffusion and a second P-type floating diffusion region, and a P-type transistor group.

The N-type transistor group may include an N-type reset transistor, an N-type driving transistor, and an N-type selecting transistor.

The P-type transistor group may include a P-type reset transistor, a P-type driving transistor, and a P-type selecting transistor.

The first and the second N-type floating diffusion regions may include electrically connected to the N-type reset transistor, the N-type driving transistor, and the N-type selecting transistor of the N-type transistor group.

The first and the second P-type floating diffusion regions may be electrically connected to the P-type reset transistor, the P-type driving transistor, and the P-type selecting transistor of the P-type transistor group.

In another embodiment of the disclosed technology, an image sensor may include a photoelectric conversion device array including a plurality of photoelectric conversion devices configured to generate charge carriers in response to optical energy incident on the photoelectric conversion devices, a plurality of floating diffusion regions, each of which is situated adjacent to one of the plurality of photoelectric conversion devices to transfer the charge carriers, and a plurality of transistors configured to convert the charges of the charge carriers into voltage signals. The photoelectric conversion devices are spatially arranged in rows and columns in the photoelectric conversion device array. Each of the plurality of photoelectric conversion devices may include a charge collection area that collects the photo-generated charge carriers. The collection area of each photoelectric conversion device may be structured to collect charge carriers different in polarity from charge carriers collected by photodiode charge collection areas of adjacent photoelectric conversion devices in a same row or column within the photoelectric conversion device.

Those embodiments and other aspects of the disclosed technology are described in detail in the drawings, the description and the claims.

DETAILED DESCRIPTION

Figure 1:
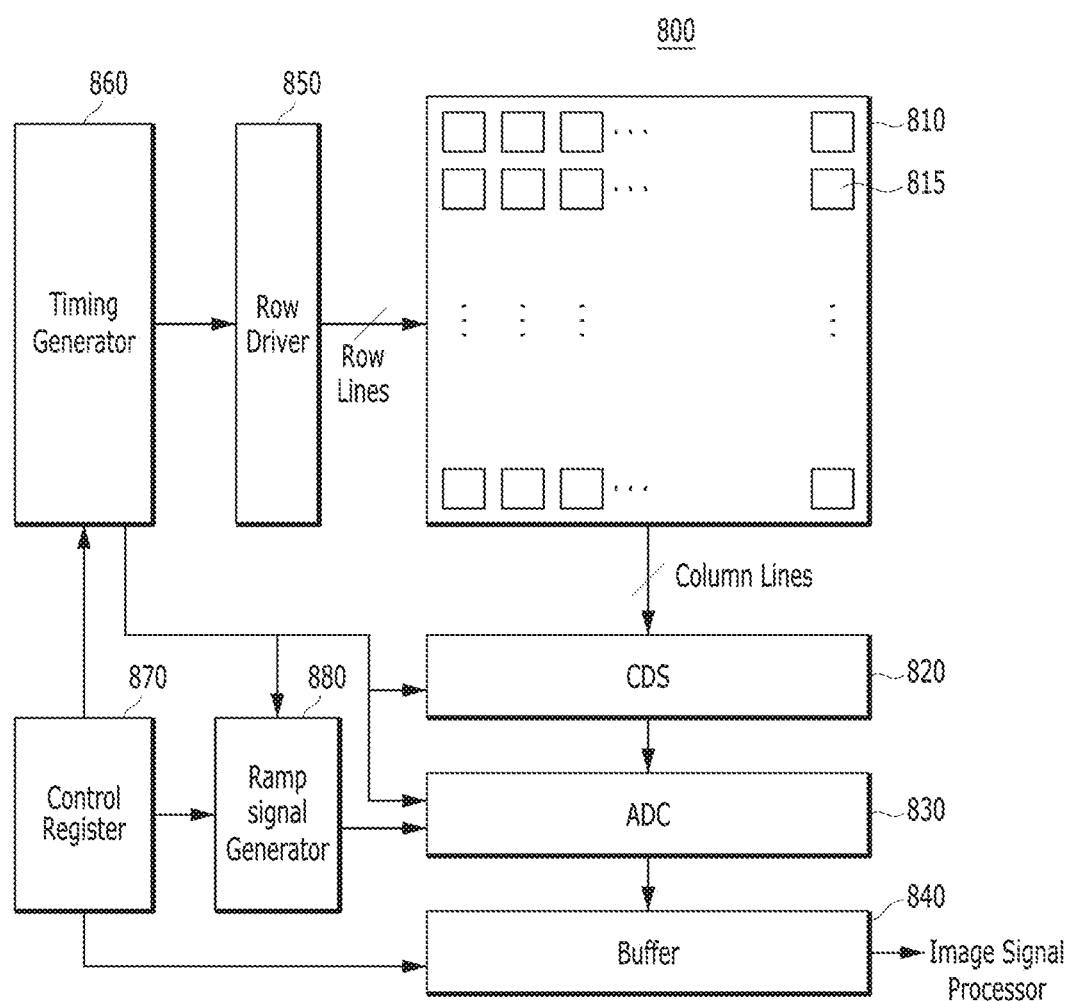
FIG. 1 is a diagram schematically illustrating an example of an image sensor based on an embodiment of the disclosed technology.

Embodiments of the disclosed technology will be described with reference to cross-sectional views and/or plan views which have been shown and described by way of illustration. In the drawings, the thicknesses of layers and regions may be exaggerated for clarity of illustration. Thus, the illustrated views may be modified depending on fabrication techniques and/or allowable errors. Therefore, embodiments of the disclosed technology are not limited to specific shapes illustrated in the drawings but may include other shapes which are created according to a fabrication process. For example, an angled region may have a curved shape or a certain curvature. Therefore, regions illustrated in the drawings are schematic in nature and their shapes are not intended to illustrate the precise shape of an element and are not intended to limit the scope of the disclosed technology.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is a diagram schematically illustrating an example of an image sensor 800 based on an embodiment of the disclosed technology. Referring to FIG. 1, an image sensor 800 may include a pixel array 810, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixel blocks 815 that are arranged in a matrix structure. The pixel blocks 815 may transform optical image information to electrical image signals and transmit the image signals to the correlated double sampler 820 through column lines, respectively. The pixel blocks 815 may be electrically connected to one of the row lines and one of the column lines, respectively.

The correlated double sampler 820 may hold and sample the electrical image signals that are received from the pixels of the pixel array 810. For example, the correlated double sampler 820 may sample a reference voltage level and voltage levels of the received electrical image signals according to a clock signal provided by the timing generator 860, and transmit analog signals corresponding to the difference between the two voltage levels to the analog-to-digital converter 830.

The analog-to-digital converter 830 may convert the received analog signals into digital signals and transfer the digital signals to the buffer 840. The buffer 840 may store or latch the digital signals received from the analog-to-digital converter 830 and sequentially output the digital signals to an external image signal processor. The buffer 840 may include a memory to temporarily store or latch the digital signals, and a sense amplifier to amplify the digital signals.

The row driver 850 may drive pixels of the pixel blocks 815 in the pixel array 810 according to timing signals transmitted from the timing generator 860. For example, the row driver 850 may generate selecting signals to select one of the row lines and/or driving signals to drive one of the row lines.

The timing generator 860 may generate timing signals to control the correlated double sampler 820, the analog-to-digital converter 830, the row driver 850, and the ramp signal generator 880.

The control register 870 may generate control signals to control the buffer 840, the timing generator 860, and the ramp signal generator 880.

The ramp signal generator 880 may generate a ramp signal to control the electrical image signals to be output signal from the analog-to-digital convertor 830 to the buffer 840 according to the timing generator 860.

Each pixel block 815 of the image sensor 800 can include a photosensor or photosensing element that converts received light into electrical charges, which may be implemented in a suitable configuration, including a photodiode, a photogate, a phototransistor, a photoconductor, or some other photosensitive structure capable of generating photo-generated electrical charges. Each imaging pixel can also include a charge storage region for storing the photo-generated charges, which may be constructed as, for example, a floating diffusion region as disclosed in the examples below. Additional circuitry may be included in each imaging pixel, e.g., a transfer transistor for transferring the photo-generated charges from the photosensor to the storage region and a reset circuitry for resetting the charges in the charge storage region after a readout.

Figure 2:
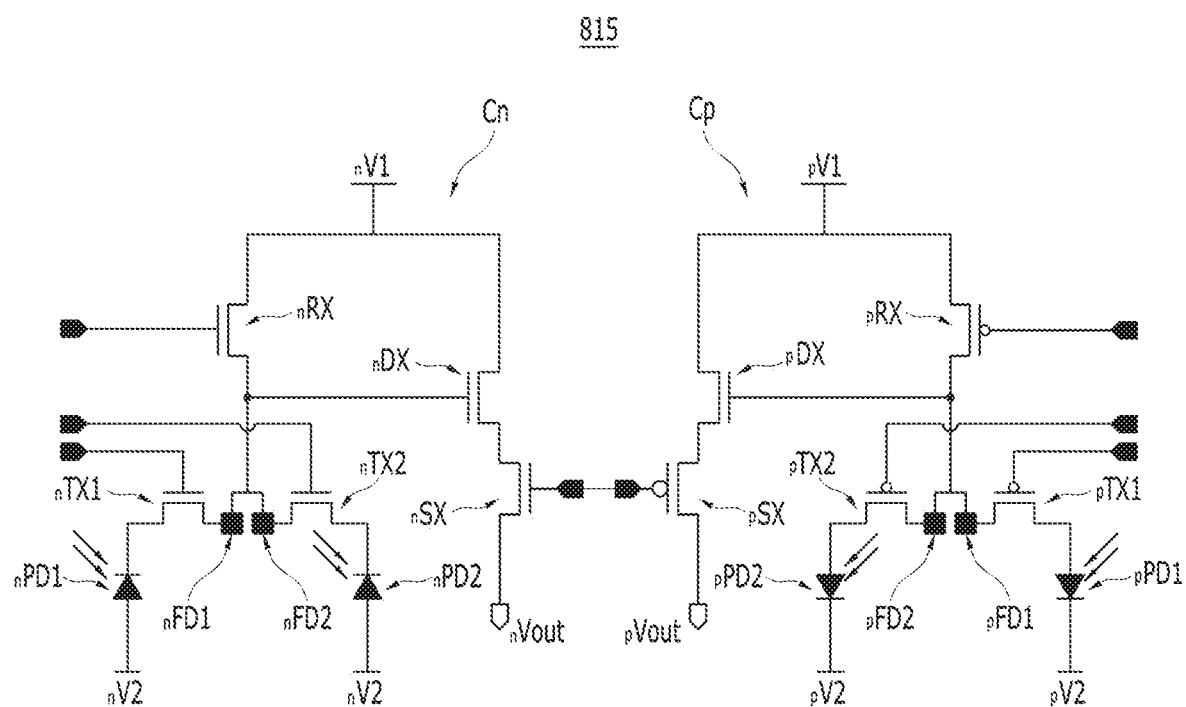
FIG. 2 is a circuit diagram illustrating an example of a pixel block of an image sensor based on an embodiment of the disclosed technology.

FIG. 2 is a circuit diagram illustrating a specific example of a pixel block 815 of the image sensor 800 based on an embodiment of the disclosed technology. Referring to FIG. 2, this example of the pixel block 815 may include an N-type pixel circuit Cn and a P-type pixel circuit Cp.

The N-type pixel circuit Cn within the pixel block 815 may include a first N-type photodiode nPD1 and a second N-type photodiode nPD2, a first N-type transfer transistor nTX1 and a second N-type transfer transistor nTX2, a first N-type floating diffusion region nFD1 and a second N-type floating diffusion region nFD2, an N-type reset transistor nRX, an N-type driving transistor nDX, and an N-type selecting transistor nSX. The P-type pixel circuit Cp within the pixel block 815 may include a first P-type photodiode pPD1 and a second P-type photodiode pPD2, a first P-type transfer transistor pTX1 and a second P-type transfer transistor pTX2, a first floating diffusion region pFD1 and a second P-type floating diffusion region pFD2, a P-type reset transistor pRX, a P-type driving transistor pDX, and a P-type selecting transistor pSX.

Here, the N-type photodiode may indicate an N-type doped region of a first photodiode and the P-type photodiode may indicate a P-type doped region of a second photodiode that have different configurations from each other. For example, the "N-type photodiode" may indicate a photoelectric conversion device that includes an N-type photon receiving region formed on a P-type region that is coupled to a ground voltage terminal, and the "P-type photodiode" may indicate another photoelectric conversion device that includes a P-type photon receiving region formed on an N-type region that is coupled to a power supply voltage terminal. Alternatively, the "N-type photodiode" may indicate a photoelectric conversion device that includes an P-type photon receiving region formed on a N-type region that is coupled to a ground voltage terminal, and the "P-type photodiode" may indicate another photoelectric conversion device that includes a N-type photon receiving region formed on an P-type region that is coupled to a power supply voltage terminal. In some embodiment, the N-type photodiode may indicate an N-type doped region of a P/N photodiode and the P-type photodiode may indicate a P-type doped region of an N/P photodiode.

The first and second N-type photodiodes nPD1 and nPD2 and the first and second P-type photodiodes pPD1 and pPD2 may receive light and generate photo-induced charge carriers, such as electron-hole pairs caused by absorption of light. The charge carriers (e.g., electrons) generated in the first and second N-type photodiodes nPD1 and nPD2 may be transferred to the first and second N-type floating diffusion regions nFD1 and nFD2 through the first and second N-type transfer transistors nTX1 and nTX2, respectively. The first and second N-type floating diffusion regions nFD1 and nFD2 may be electrically connected with each other. A voltage corresponding to the amount of the charge carriers (e.g., electrons) in the first and second N-type floating diffusion regions nFD1 and nFD2 may be applied to a gate electrode of the N-type driving transistor nDX. The N-type driving transistor nDX acts as a source follower, and thus its output voltage follows the voltage applied to the gate electrode thereof. The voltage signal output from the N-type driving transistor nDX is transferred to an N-type output port nVout through the N-type selecting transistor nSX. After the voltage or current is output to the N-type output port nVout, the N-type reset transistor nRX may be turned on to reset the first and second N-type floating diffusion regions nFD1 and nFD2 to be equal to the first N-type voltage nV1. N-type electrodes of the first and second N-type photodiodes nPD1 and nPD2 may be electrically connected to a second N-type voltage nV2. For example, the first N-type voltage nV1 may be a power supply voltage and the second N-type voltage nV2 may be a ground voltage.

The charge carriers (e.g., holes) generated in the first and second P-type photodiodes pPD1 and pPD2 may be transferred to the first and second P-type floating diffusion regions pFD1 and pFD2 through the first and second P-type transfer transistors pTX1 and pTX2. The first and second P-type floating diffusion regions pFD1 and pFD2 may be electrically connected to each other. A voltage corresponding to the amount of the charge carriers (e.g., holes) in the first and second P-type floating diffusion regions pFD1 and pFD2 may be applied to a gate electrode of the P-type driving transistor pDX. The P-type driving transistor pDX acts as a source follower, and thus its output voltage follows the voltage applied to the gate electrode thereof. The voltage signal output from the P-type driving transistor pDX is transferred to a P-type output port pVout through the P-type selecting transistor pSX. After the voltage or current is output to the P-type output port pVout, the P-type reset transistor pRX may be turned on to reset the first and second P-type floating diffusion regions pFD1 and pFD2 to be equal to the first P-type voltage pV1. P-type electrodes of the first and second P-type photodiodes pPD1 and pPD2 may be electrically connected to a second P-type voltage pV2. For example, the first P-type voltage pV1 may be a ground voltage and the second P-type voltage pV2 may be a power supply voltage. In another embodiment, the first P-type voltage pV1 may be the power supply voltage and the second P-type voltage pV2 may be the ground voltage.

Figure 3:
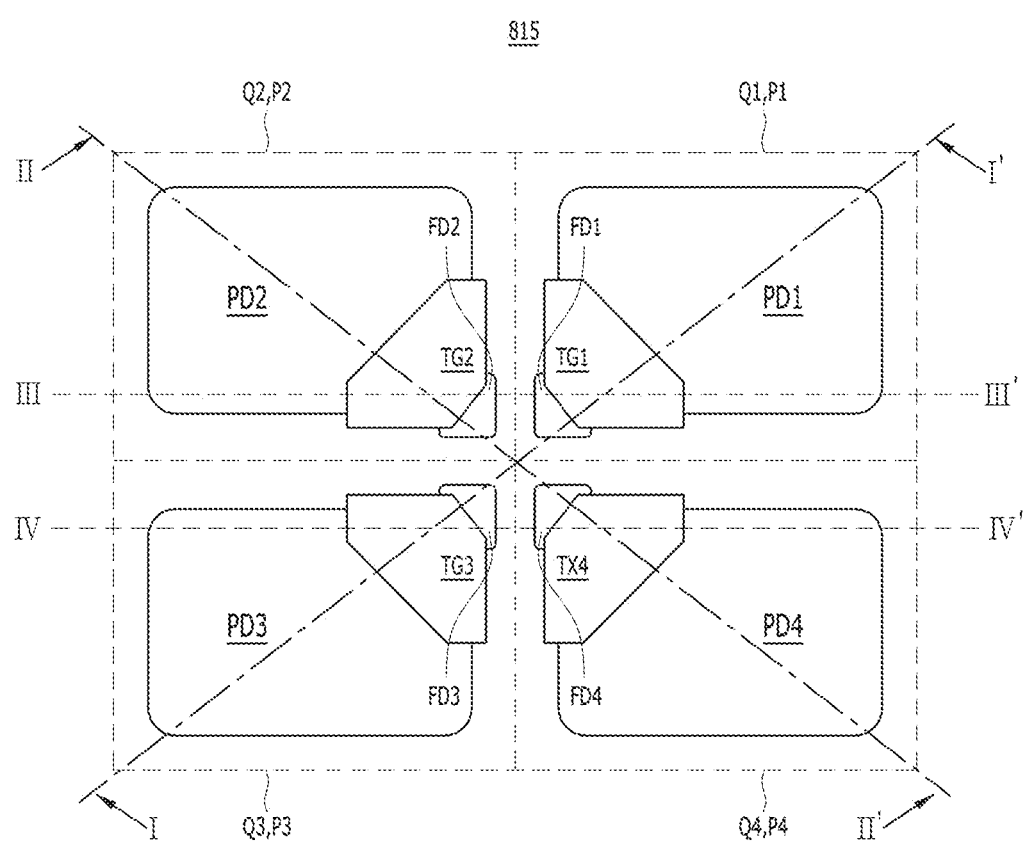
FIG. 3 is a top view schematically illustrating an example of a pixel block of an image sensor based on an embodiment of the disclosed technology.

FIG. 3 is a top view schematically illustrating an example of a pixel block 815 of an image sensor 800 based on an embodiment of the disclosed technology. Referring to FIG. 3, a pixel block 815 of the image sensor 800 based on an example embodiment may include four unit pixels P1-P4 arranged in a matrix form in rows and columns along two orthogonal directions. That is, the pixel block 815 may include first to fourth unit pixels P1 to P4 arranged in first to fourth quadrants Q1 to Q4, respectively, so that the unit pixels P1 and P2 are in the top row, the unit pixels P2 and P4 are in the bottom row, the unit pixels P2 and P3 are in the left column and the unit pixels P1 and P4 are in the right column. Under this arrangement, two adjacent unit pixels in the same row or column are designed to include photodiodes having opposite charge polarities.

The first unit pixel P1 in the first quadrant Q1 may include a first photodiode PD1, a first transfer gate TG1, and a first floating diffusion region FD1. The second unit pixel P2 in the second quadrant Q2 may include a second photodiode PD2, a second transfer gate TG2, and a second floating diffusion region FD2. The third unit pixel P3 in the third quadrant Q3 may include a third photodiode PD3, a third transfer gate TG3, and a third floating diffusion region FD3. The fourth unit pixel P4 in the fourth quadrant Q4 may include a fourth photodiode PD4, a fourth transfer gate TG4, and a fourth floating diffusion region FD4.

The first to fourth transfer gates TG1 to TG4 and the first to fourth floating diffusion regions FD1 to FD2 may be disposed to face a center portion of the pixel block 815. That is, the first to fourth unit pixels P1-P4 may be symmetrically arranged about the center point of the layout illustrated in FIG. 3. The first to fourth transfer gates TG1 to TG4 may correspond to ones of the gate electrodes of the first and second N-type transfer transistors nTX1 and nTX2 and the first and second P-type transfer transistors pTX1 and pTX2, respectively. For example, the first to fourth floating diffusion regions FD1 to FD4 may be disposed relatively closer to each other than the first to fourth transfer gates TG1 to TG4 and the first to fourth photodiodes PD1 to PD4.

In implementations having P-type photodiodes and N-type photodiodes in each pixel block of the pixel array, the photodiodes in each pixel block can be arranged in a quartet (e.g., pixel block discussed above) ordered in successive rows that alternate either P-type photodiodes and N-type photodiodes or N-type photodiodes and P-type photodiodes. In each quartet, the first to fourth photodiodes PD1 to PD4 may be arranged such that photodiodes of the same type are not adjacent to one another. For example, photodiodes of the same type are arranged along diagonal directions. Specifically, the first photodiode PD1 and the third photodiode PD3 arranged along a first diagonal direction I-I' to face each other may be first type photodiodes, and the second photodiode PD2 and the fourth photodiode PD4 arranged along a second diagonal direction II-II' to face each other may be second type photodiodes different from the first type photodiodes. For example, the first photodiode PD1 and the third photodiode PD3 may be N-type photodiodes, and the second photodiode PD2 and the fourth photodiode PD4 may be P-type photodiodes. Referring again to FIG. 2, the first photodiode PD1 and the third photodiode PD3 may correspond to one of the first and second N-type photodiodes nPD1 and nPD2, respectively, and the second photodiode PD2 and the fourth photodiode PD4 may correspond to one of the first and second P-type photodiodes pPD1 and pPD2, respectively.

In another embodiment, the first photodiode PD1 and the third photodiode PD3 may be the P-type photodiodes, and the second photodiode PD2 and the fourth photodiode PD3 may be N-type photodiodes. That is, referring again to FIG. 2, the first photodiode PD1 and the third photodiode PD3 may correspond to one of the first and second P-type photodiodes pPD1 and pPD2, respectively, and the second photodiode PD2 and the fourth photodiode PD4 may correspond to one of the first and second N-type photodiodes nPD1 and nPD2, respectively.

The first to fourth transfer gates TG1 to TG4 may have gate electrodes having the same polarities as the first to fourth photodiodes PD1 to PD4 disposed in the first to fourth quadrants Q1 to Q4, respectively. That is, the first to fourth transfer gates TG1 to TG4 may be arranged such that transfer gates of the same type are not adjacent to one another. For example, transfer gates of the same type are arranged along the first and second diagonal directions, respectively. Specifically, the first transfer gate TG1 and the third transfer gate TG3 arranged along the same diagonal direction may have a gate electrode having a first polarity type, and the second transfer gate TG2 and the fourth transfer gate TG4 may have a gate electrode having a second polarity type different from the first polarity type. For example, the first transfer gate TG1 and the third transfer gate TG3 may have N-type gate electrodes, and the second transfer gate TG2 and the fourth transfer gate TG4 may have P-type gate electrodes.

In another embodiment, the first transfer gate TG1 and the third transfer gate TG3 may have the P-type gate electrodes, and the second transfer gate TG2 and the fourth transfer gate TG4 may have the N-type gate electrodes. Further referring to FIG. 2, the first transfer gate TG1 and the third transfer gate TG3 may correspond to one of the gate electrodes of the first and second N-type transfer transistors nTX1 and nTX2, respectively, and the second transfer gate TG2 and the fourth transfer gate TG4 may correspond to one of the gate electrodes of the first and second P-type transfer transistors pTX1 and pTX2, respectively.

The first to fourth floating diffusion regions FD1 to FD4 may include doped regions having the same polarities as the first to fourth photodiodes PD1 to PD4 and the first to fourth transfer gates TG1 to TG4 disposed in the first to fourth quadrants Q1 to Q4, respectively. That is, the first to fourth floating diffusion regions FD1-FD4 facing each other may also have doped regions having the same polarities along diagonal directions, respectively. Specifically, the first floating diffusion region FD1 and the third floating diffusion region FD3 arranged to face each other along the first diagonal direction may respectively have a doped region having a first polarity type, and the second floating diffusion region FD2 and the fourth floating diffusion region FD4 arranged to face each other along the second diagonal direction may respectively have a doped region having a second polarity type different from the first polarity type. For example, the first floating diffusion region FD1 and the third floating diffusion region FD3 may include an N-type doped region, and the second floating diffusion region FD2 and the fourth floating diffusion region FD4 may have a P-type doped region, respectively. Referring to FIG. 2, the first floating diffusion region FD1 and the third floating diffusion region FD3 may correspond to one of the first and second N-type floating diffusion regions nFD1 and nFD2, respectively, and the second floating diffusion region FD2 and the fourth floating diffusion region FD4 may correspond to one of the first and second P-type floating diffusion regions pFD1 and pFD2, respectively.

In another embodiment, the first floating diffusion region FD1 and the third floating diffusion region FD3 may have the P-type doped region, and the second floating diffusion region FD2 and the fourth floating diffusion region FD4 may have the N-type doped region, respectively. The first floating diffusion region FD1 and the third floating diffusion region FD3 may be electrically connected to each other, and the second floating diffusion region FD2 and the fourth floating diffusion region FD4 may be electrically connected to each other.

In an embodiment, the diagonally facing elements can have the same polarities, and the elements that are adjacent in the horizontal or vertical directions may have different polarities.

In an embodiment, the first and third unit pixels P1 and P3 may be a red color pixel for sensing red light or a blue color pixel for sensing blue light, respectively, and the second and fourth unit pixels P2 and P4 may be green color pixels for sensing green light.

In another embodiment, the first and third unit pixels P1 and P3 may be green color pixels for sensing green light, and the second and fourth unit pixels P2 and P4 may be a red color pixel for sensing red light or a blue color pixel for sensing blue light, respectively.

The pixel blocks of the conventional image sensor or other image sensors tend to have the same type of photodiodes, transfer gates, and floating diffusion regions. Since all photodiodes generate charge carriers of the same type in response to light incident on the photodiodes, the photo-generated charge carriers generated and collected in the photodiodes can adversely affect neighboring photodiodes. For example, the charge carriers generated in one photodiode may cause a blooming effect or a cross-talk effect in neighboring photodiodes. The pixel block implemented based on the disclosed technology can prevent or minimize such effects by arranging photodiodes such that photodiodes of different types are arranged adjacent to each other. A potential barrier (e.g., a depletion region) is formed between photodiodes of different types. Thus, the charge carriers (e.g., electrons) generated in the N-type photodiode and the charge carriers (e.g., holes) generated in the P-type photodiode will be less likely to influence one another due to the potential barrier. That is, electrical influences (blooming effect or cross-talk effect) between adjacent photodiodes may be minimized. Under such a design, even when the optical carriers move to adjacent different types of photodiodes, the excess optical carriers generated in one photodiode are the minority carriers in the adjacent other photodiodes, so that the optical and electrical influences between adjacent photodiodes caused by such carriers from adjacent photodiodes tend to be small. In addition, since the electrical influences between adjacent photodiodes are substantially suppressed, optical sensitivities and quantum efficiency of unit pixels are improved.

In some implementations, photoelectric conversion devices (e.g., photodiodes) of image sensors may have charge collection areas that collect photo-generated charge carriers (e.g., photo-generated minority charge carriers). Various embodiments of the disclosed technology utilize two different types of charge carriers as the photo-generated charge carriers and arrange photodiodes so that charge collection areas of two closest photodiodes collect different types of charge carriers. For example, if the charge collection area of a photodiode collects photo-generated electrons, the charge collection areas of the nearest photodiodes collect photo-generated holes. In this way, every photodiode charge collection area collects charge carriers different from those collected by photodiode charge collection areas at the closest distance. The image sensor may also include a plurality of floating diffusion regions, each of which is situated adjacent to one of the plurality of photoelectric conversion devices to transfer the charge carriers. Each floating diffusion region transfers charge carriers different in polarity from those transferred by floating diffusion regions at the closest distance.

In some embodiments, since the adjacent photodiodes have different types, it is not necessary to form trench isolation regions or ion implantation regions for optical shielding and electrical insulation between the adjacent photodiodes of different types so that the photodiodes of different types can be more densely arranged in a given area than photodiodes of the same type with trench isolation regions. Accordingly, the disclosed technology is advantageous to realizing high-resolution, high-density image sensors.

Figure 4A:
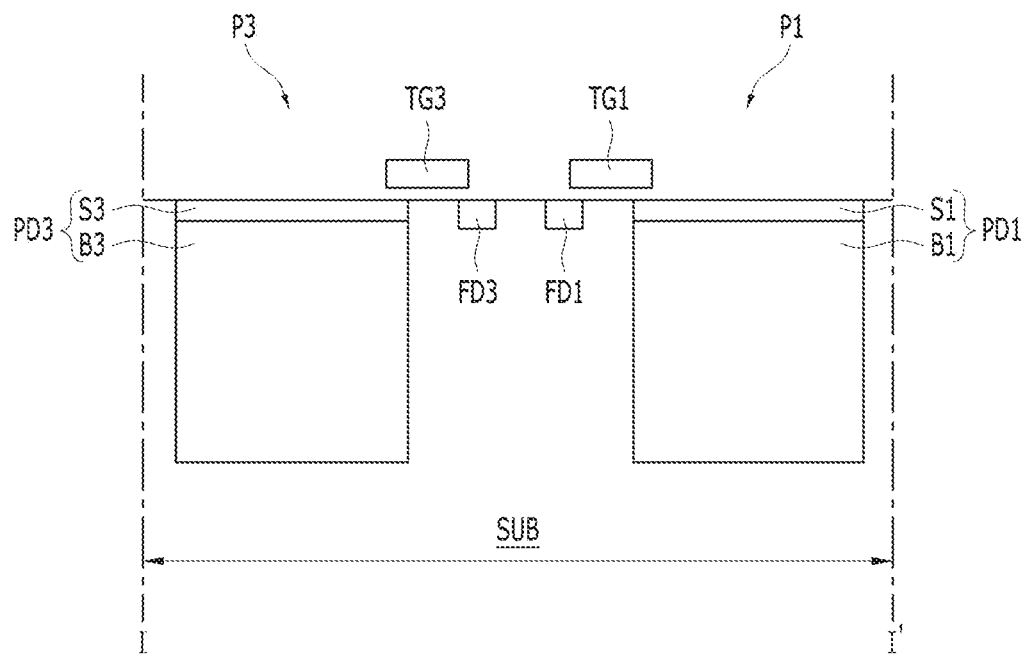
FIGS. 4A to 4D are cross-sectional views taken along lines I-I', II-II', III-III' and IV-IV' of the pixel block of the image sensor shown in FIG. 3, respectively.

FIGS. 4A to 4D are cross-sectional views taken along lines I-I', II-II', III-III' and IV-IV' of the pixel block 815 of the image sensor 800 shown in FIG. 3, respectively. Referring to FIG. 4A showing the structures of the photodiodes PD1 and PD3 along the diagonal direction I-I', the first photodiode PD1 of the first unit pixel P1 of the pixel block 815 of the image sensor 800 may include a first doped bulk region B1, which is formed in a substrate SUB, and a first doped surface region S1 formed over the first doped bulk region B1 at or near a height at which a surface of the substrate SUB resides, and the third photodiode PD3 of the third unit pixel P3 of the pixel block 815 of the image sensor 800 may include a third doped bulk region B3, which is formed in the substrate SUB, and a third doped surface region S3, which is formed over the third doped bulk region B3 and situated at or near the height at which the surface of the substrate SUB resides. The substrate SUB may be a single crystalline silicon layer having a P-type epitaxial growth layer.

The first doped bulk region B1 and the third doped bulk region B3 diagonally facing each other may have the same polarity.

The first doped surface region S1 and the third doped surface region S3 diagonally facing each other is designed to have a polarity different from that of the first doped bulk region B1 and the third doped bulk region B3, respectively.

For example, the first doped surface region S1 and the third doped surface region S3 may be P-type doped regions while the first doped bulk region B1 and the third doped bulk region B3 may be N-type doped regions.

The first doped bulk region B1 and the first doped surface region S1 of the first photodiode PD1 of the first unit pixel P1 may have different polarities with each other, and the third doped bulk region B3 and the third doped surface region S3 of the third photodiode PD3 of the third unit pixel P3 may have different polarities with each other. Under this design, the first doped surface region S1 and the underlying first doped bulk region B1 interface with each other with different doping polarities to form a p-n junction in the first photodiode PD1 for optical detection, and the third doped surface region S3 and the underlying third doped bulk region B3 interface with each other with different doping polarities to form a p-n junction in the third photodiode PD3 for optical detection. The first and third photodiodes PD1 and PD3 are N-type photodiodes when the first and third doped surface regions S1 and S3 are P-type regions while the underlying first and third doped bulk regions B1 and B3 are N-doped regions. The first and third photodiodes PD1 and PD3 are P-type photodiodes when the first and third doped surface regions S1 and S3 are N-type regions while the underlying first and third doped bulk regions B1 and B3 are P-doped regions.

The first transfer gate TG1 of the first unit pixel P1 may be disposed on the surface of the substrate SUB, and the first floating diffusion region FD1 of the first unit pixel P1 may be formed in the substrate SUB and situated at or near the height at which the surface of the substrate SUB resides. The third transfer gate TG3 of the third unit pixel P3 may be disposed on the surface of the substrate SUB, and the third floating diffusion region FD3 of the third unit pixel P3 may be formed in the substrate SUB and situated at or near the height at which the surface of the substrate SUB resides.

The first transfer gate TG1 and the first floating diffusion region FD1 may have the same polarity as the first doped bulk region B1. For example, when the first doped bulk region B1 is an N-type doped region, the first transfer gate TG1 and the first floating diffusion region FD1 may be N-type conductors.

The third transfer gate TG3 and the third floating diffusion region FD3 may have the same polarity as the third doped bulk region B3. For example, when the third doped bulk region B3 is the N-type doped region, the third transfer gate TG3 and the third floating diffusion region FD3 may be N-type conductors. In another embodiment, the first transfer gate TG1 and the third transfer gate TG3 may include at least one of a metal, a metal compound, a metal alloy, and combinations thereof.

Figure 4B:
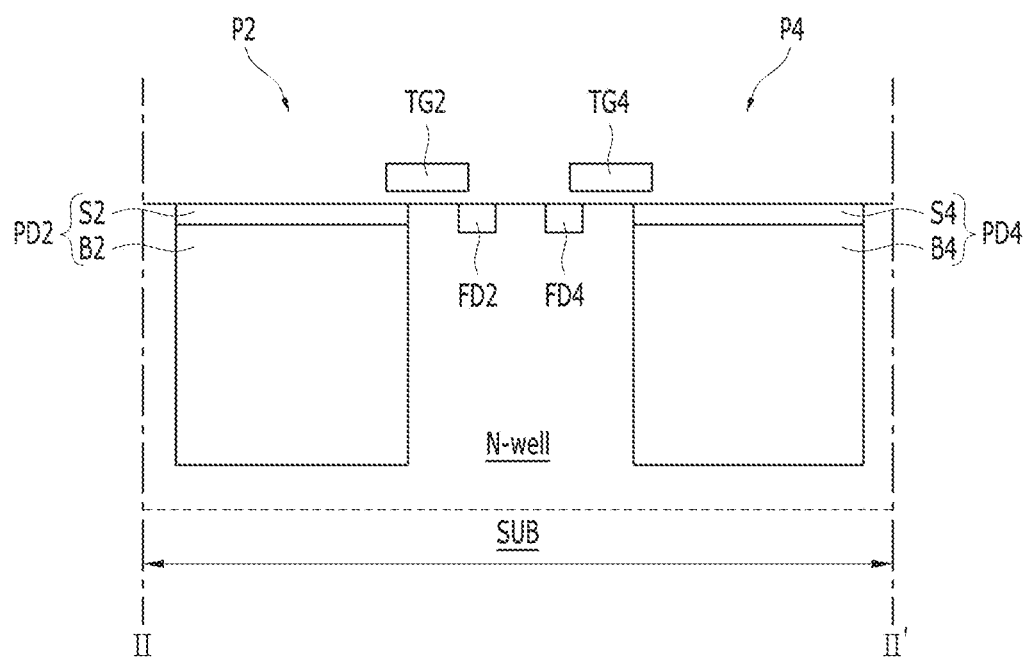

Referring to FIG. 4B showing the structures of the photodiodes PD2 and PD4 along the diagonal direction the second photodiode PD2 of the second unit pixel P2 of the pixel block 815 of the image sensor 800 based on an implementation of the disclosed technology may include a second doped bulk region B2, which is formed in a doped well region (e.g., an N-well region) in the substrate SUB, and a second doped surface region S2, which is formed over the second doped bulk region B2 and situated at or near the height at which the surface of the substrate SUB resides, and the fourth photodiode PD4 of the fourth unit pixel P4 of the pixel block 815 of the image sensor 800 based on an implementation of the disclosed technology may include a fourth doped bulk region B4 formed in the N-well region in the substrate SUB and a fourth doped surface region S4, which is formed over the fourth doped bulk region B4 and situated at or near the height at which the surface of the substrate SUB resides. In the example of having an N-well region as the doped well region in the substrate SUB, the N-well region includes N-type ions in the substrate SUB.

The second doped bulk region B2 and the fourth doped bulk region B4 diagonally facing each other may have the same polarity. For example, the second doped bulk region B2 and the fourth doped bulk region B4 may be P-type doped regions.

The second doped surface region S2 and the fourth doped surface region S4 diagonally facing each other may have the same polarity different from the polarity of the second doped bulk region B2 and the fourth doped bulk region B4. For example, when the second doped bulk region B2 and the fourth doped bulk region B4 are P-type doped regions, the second doped surface region S2 and the fourth doped surface region S4 may be N-type doped regions.

The second doped bulk region B2 and the second doped surface region S2 of the second photodiode PD2 of the second unit pixel P2 may have different polarities with each other and the fourth doped bulk region B4 and the fourth doped surface region S4 of the fourth photodiode PD4 of the fourth unit pixel P4 may have different polarities with each other. Under this design, the doped surface region S2 and the underlying doped bulk region B2 interface with each other with different doping polarities to form a p-n junction in the second photodiode PD2 for optical detection, and the doped surface region S4 and the underlying doped bulk region B4 interface with each other with different doping polarities to form a p-n junction in the fourth photodiode PD4 for optical detection. The PD2 and PD4 are N-type photodiodes when the doped surface regions S2 and S4 are P-type regions while the underlying doped bulk regions B2 and B4 are N-doped regions. The PD2 and PD4 are P-type photodiodes when the doped surface regions S2 and S4 are N-type regions while the underlying doped bulk regions B2 and B4 are P-doped regions.

The second transfer gate TG2 of the second unit pixel P2 may be disposed on the surface of the substrate SUB, and the second floating diffusion region FD2 of the second unit pixel P2 may be formed in the substrate SUB and situated at or near the height at which the surface of the substrate SUB resides. The fourth transfer gate TG4 of the fourth unit pixel P4 may be disposed on the surface of the substrate SUB, and the fourth floating diffusion region FD4 of the fourth unit pixel P4 may be formed in the substrate SUB and situated at or near the height at which the surface of the substrate SUB resides.

The second transfer gate TG2 and the second floating diffusion region FD2 may have the same polarity as the second doped bulk region B2. For example, when the second doped bulk region B2 is a P-type doped region, the second transfer gate TG2 and the second floating diffusion region FD2 may be P-type conductors.

The fourth transfer gate TG4 and the fourth floating diffusion region FD4 may have the same polarity as the fourth doped bulk region B4. For example, when the fourth doped bulk region B4 is a P-type doped region, the fourth transfer gate TG4 and the fourth floating diffusion region FD4 may be P-type conductors.

Figure 4C:
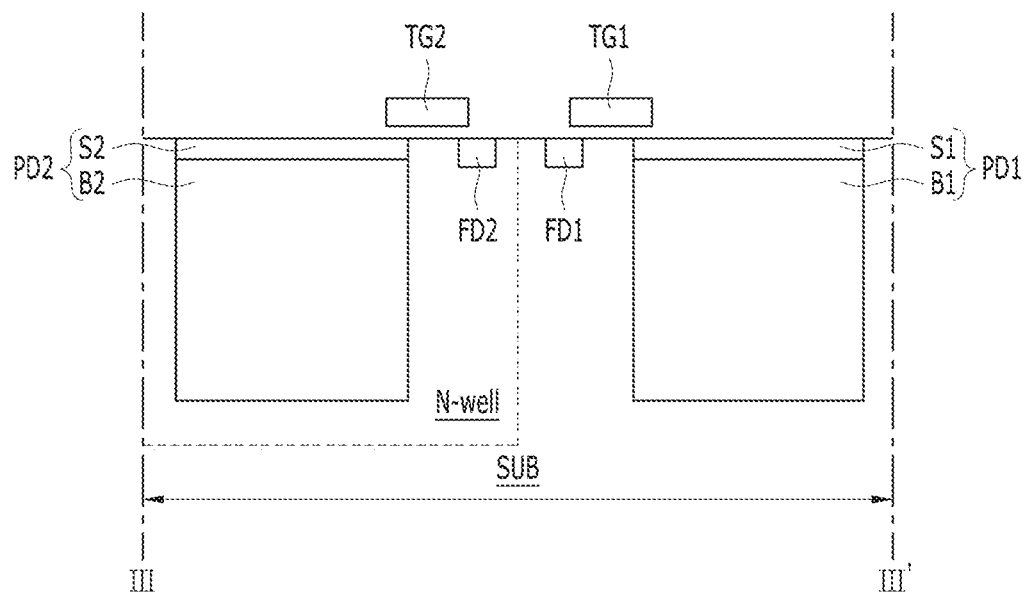

Referring to FIG. 4C, the first photodiode PD1 of the first unit pixel P1 may include the first doped bulk region B1 and the first doped surface region S1 having different polarities, and the second photodiode PD2 of the second unit pixel P2 may include the second doped bulk region B2 and the second doped surface region S2 having different polarities.

For example, when the substrate SUB is a P-type doped region, the first doped bulk region B1 of the first photodiode PD1 may be the N-type doped region, and the doped surface region S1 of the first photodiode PD1 may be the P-type doped region. In addition, when the second doped bulk region B2 of the second photodiode PD2 is the P-type doped region surrounded by the N-well region, the second doped surface region S1 may be the N-type doped region.

The first doped bulk region B1 of the first photodiode PD1 and the second doped bulk region B2 of the second photodiode PD2 adjacent to each other may have different polarities. For example, when the first doped bulk region B1 of the first photodiode PD1 is the N-type doped region, the second doped bulk region B2 of the second photodiode PD2 may be the P-type doped region.

The first doped surface region S1 of the first photodiode PD1 and the second doped surface region S2 of the second photodiode PD2 adjacent to each other may have different polarities. For example, when the first doped surface region S1 of the first photodiode PD1 is the P-type doped region, the second doped surface region S2 of the second photodiode PD2 may be N-type doped region.

The first transfer gate TG1 and the second transfer gate TG2 adjacent to each other may have different polarities. For example, when the first transfer gate TG1 is an N-type conductor, the second transfer gate TG2 may be a P-type conductor. In another embodiment, when the first transfer gate TG1 is the P-type conductor, the second transfer gate TG2 may be the N-type conductor.

The first floating diffusion region FD1 and the second floating diffusion region FD2 adjacent to each other may have different polarities. For example, when the first floating diffusion region FD1 is an N-type doped region, the second floating diffusion region FD2 surrounded by the N-well region may be a P-type doped region.

The first transfer gate TG1 and the first floating gate FD1 of the first unit pixel P1 may have the same polarity, and the second transfer gate TG2 and the second floating gate FD2 of the second unit pixel P2 may have the same polarity.

Figure 4D:
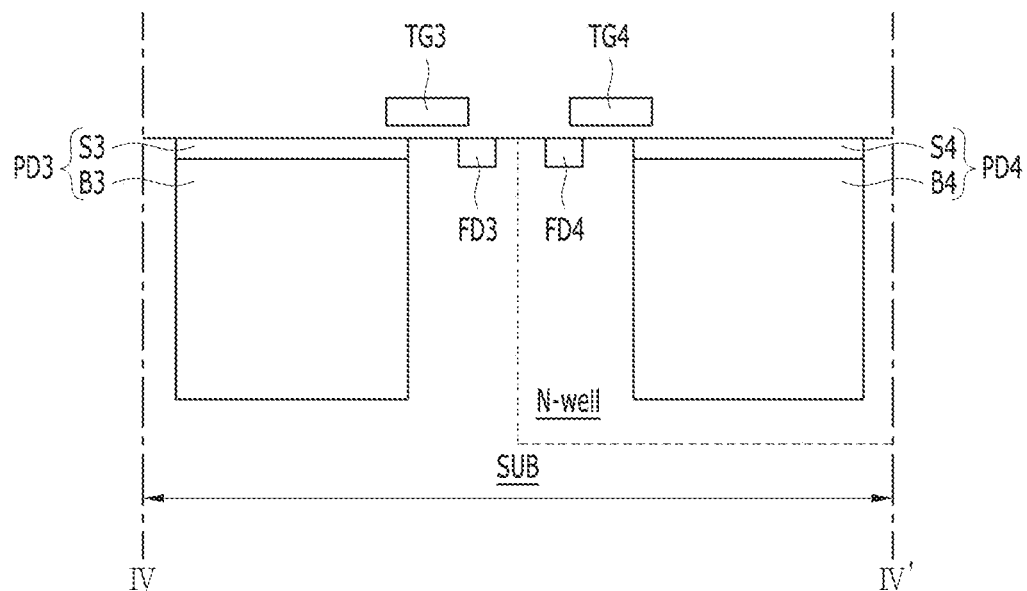

Referring to FIG. 4D, the third photodiode PD3 of the third unit pixel P3 of the pixel block 815 of the image sensor 800 based on an implementation of the disclosed technology may include the third doped bulk region B3 and the third doped surface region S3 having different polarities, and the photodiode PD4 of the fourth unit pixel P4 may include the fourth doped bulk region B4 and the fourth doped surface region S4 having different polarities.

For example, when the third doped bulk region B3 of the third photodiode PD3 is the N-type doped region, the third doped surface region S3 may be the P-type doped region surrounded by the N-well region. When the fourth doped bulk region B4 of the fourth photodiode PD4 is the P-type doped region surrounded by the N-well region, the fourth doped surface region S4 may be the N-type doped region.

The third doped bulk region B3 of the third photodiode PD3 and the fourth doped bulk region B4 of the fourth photodiode PD4 adjacent to each other may have different polarities. For example, when the third doped bulk region B3 of the third photodiode PD3 is the N-type doped region, the fourth doped bulk region B4 of the fourth photodiode PD4 may be the P-type doped region.

The third doped surface region S3 of the third photodiode PD3 and the fourth doped surface region S4 of the fourth photodiode PD4 adjacent to each other may have different polarities. For example, when the third doped surface region S3 of the third photodiode PD3 is the P-type doped region, the fourth doped surface region S4 of the fourth photodiode PD4 may be N-type doped region.

The third transfer gate TG3 and the fourth transfer gate TG4 adjacent to each other may have different polarities. For example, when the third transfer gate TG3 is the N-type conductor, the fourth transfer gate TG4 may be the P-type conductor.

The third floating diffusion region FD3 and the fourth floating diffusion region FD4 adjacent to each other may have different polarities. For example, when the third floating diffusion region FD3 is the N-type doped region, the fourth floating diffusion region FD4 may be the P-type doped region.

The third transfer gate TG3 and the third floating gate FD3 of the third unit pixel P3 may have the same polarity, and the fourth transfer gate TG4 and the fourth floating gate FD4 of the fourth unit pixel P4 may have the same polarity.

It can be understood that the first to fourth photodiodes PD1 to PD4 may correspond to the first to fourth doped bulk regions B1 to B4, respectively. Notably, under the above arrangement, the doping type of the p-n junction for photodiodes PD1 and PD3 are opposite to the doping type of the p-n unction for photodiodes PD2 and PD4.

High charge in one pixel can influence adjacent pixels and lead to the blooming effect. Some image sensors include an anti-blooming path formed at a lower portion of the transfer gate in the substrate to mitigate the blooming effect by discarding excess charge carriers. The anti-blooming path is a charge carrier path formed to have a relatively low potential so that excess charge carriers of a saturated photodiode can be discarded before the transfer gate is turned on to prevent the blooming effect between the adjacent photodiodes. In those image sensors, forming the anti-blooming path may lead to a decrease in the amount of storable charges (e.g., linear well capacitance). The disclosed technology, however, can reduce or minimize the blooming effect. In some device implementations, the blooming effect in the image sensors implemented based on the disclosed technology is strongly suppressed in the photodiodes of the image sensor based on the design in FIG. 3 so that an anti-blooming path may no longer be necessary and thus can be eliminated to improve the pixel density because the volume of the photodiode potential does not need to be reduced in such implementations so that the optical and electrical sensitivity, quantum efficiency, and resolution of the photodiodes can be increased. In other implementations, the photodiodes of the image sensor based on the design in FIG. 3 may be implemented along with an anti-blooming path to further enhance the anti-blooming operation of the imagine sensor. When the blooming path is formed, the ion implantation dose of the upper portions of the photodiodes must be lowered, so that the electric field between the adjacent ion implantation regions may be weakened and the dark characteristics (hot pixel and dark current) of the photodiodes may be deteriorated.

In some embodiments, the anti-blooming path is not formed, and the ion implantation dose of the upper portions of the photodiodes is sufficiently high, and therefore the electric field between the ion implantation regions is sufficiently strong. This can be helpful in improving the photodiode characteristics such as dark current. In addition, some embodiments based on the disclosed technology may omit formation of trench isolation regions between the photodiodes to minimize silicon defects such as dangling bonds, so that the dark current characteristic of the photodiodes can be improved.

Figure 5A:
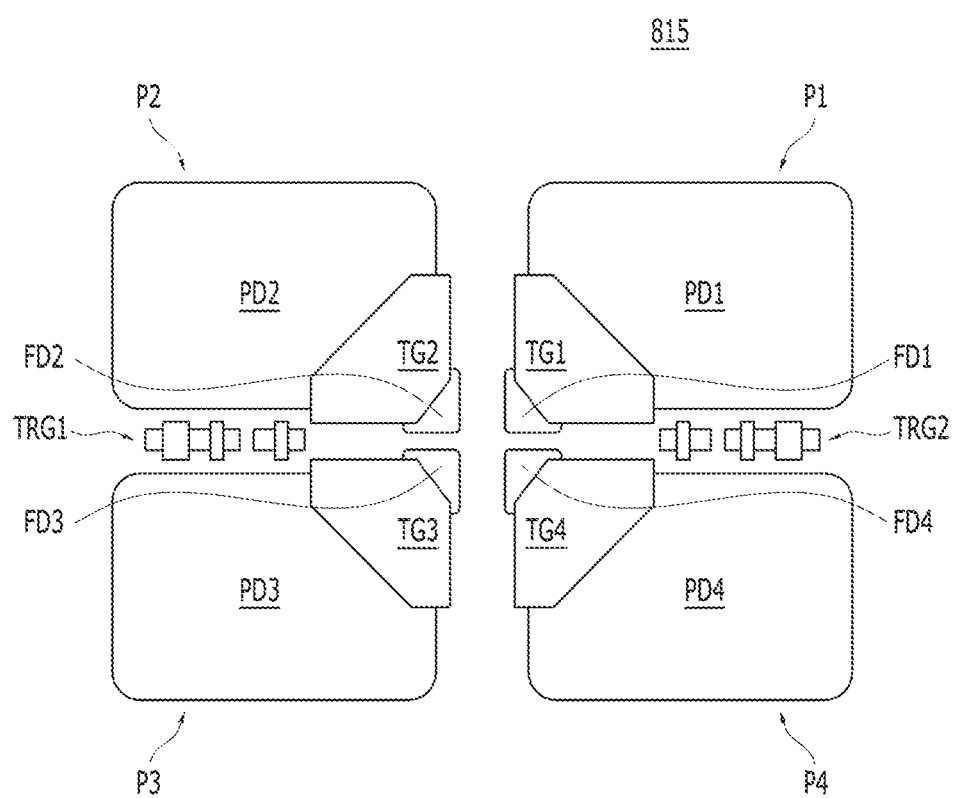
FIG. 5A is a top view schematically illustrating an example of a pixel block of an image sensor based on an embodiment of the disclosed technology.

FIG. 5A is a top view schematically illustrating an example of a pixel block 815 of an image sensor 800 based on an embodiment of the disclosed technology. Referring to FIG. 5A, a pixel block 815 of an image sensor 800 based on an embodiment may include four unit pixels P1-P4, a first transistor group TRG1, and a second transistor group TRG2.

The first transistor group TRG1 and the second transistor group TRG2 may be disposed between the unit pixels P1-P4, respectively. For example, the first transistor group TRG1 may be disposed between the second unit pixel P2 and the third unit pixel P3, and the second transistor group TRG2 may be disposed between the first unit pixel P1 and the fourth unit pixel P4.

Figure 5B:
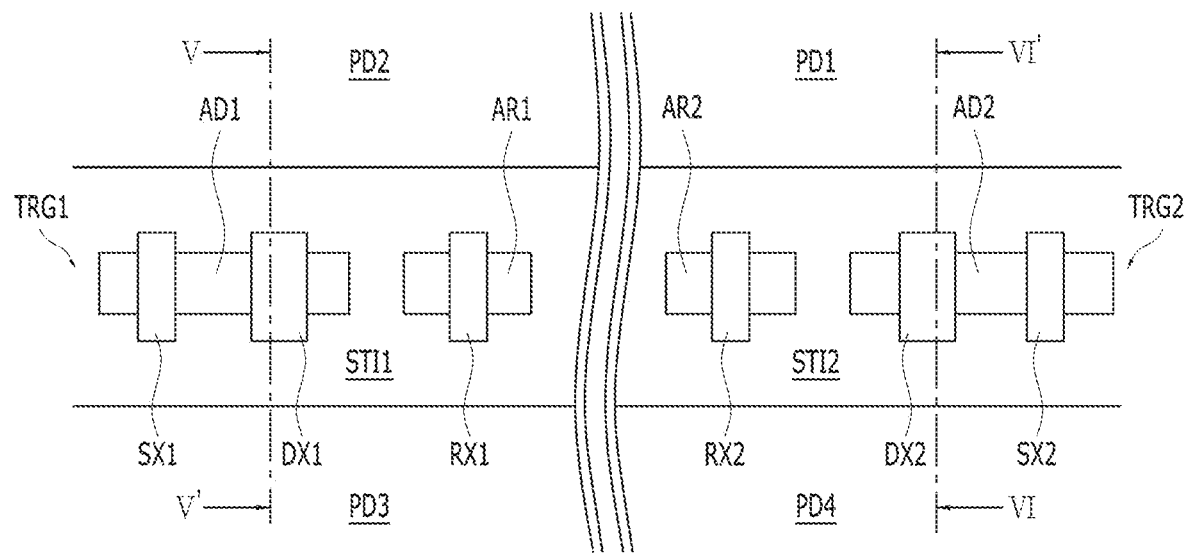
FIG. 5B is an enlarged top view of the pixel block based on an embodiment of the disclosed technology.

FIG. 5B is an enlarged top view of the pixel block 815 implemented based on an embodiment of the disclosed technology. For example, FIG. 5B illustrates enlarged views of the first transistor group TRG1 and the second transistor group TRG2.

Referring to FIG. 5B, the first transistor group TRG1 may include a first reset active region AR1 and a first driving active region AD1 defined by a first shallow trench isolation region STI1. The first transistor group TRG1 may include a first reset transistor RX1 on the first reset active area AR1, and a first driving transistor DX1 and a first selecting transistor SX1 on the first driving active area AD1. In an embodiment, the first reset active region AR1 and the first driving active region AD1 may be P-type doped regions and may have N-type channels. That is, the first reset transistor RX1, the first driving transistor DX1, and the first selecting transistor SX1 may be the N-type conductors. In another embodiment, the first reset active region AR1 and the first driving active region AD1 may be N-type doped regions and may have P-type channels. That is, the first reset transistor RX1, the first driving transistor DX1, and the first selecting transistor SX1 may be the P-type conductors.

The second transistor group TRG2 may include a second reset active region AR2 and a second driving active region AD2 defined by a second shallow trench isolation region STI2. The second transistor group TRG2 may include a second reset transistor RX2 on the second reset active region AR2, and a second driving transistor DX2 and a second selecting transistor SX2 on the second driving active area AD2. In an embodiment, the second reset active region AR2 and the second driving active region AD2 may be N-type doped regions and may have P-type channels. That is, the second reset transistor RX2, the second driving transistor DX2, and the second selecting transistor SX2 may be the P-type conductors. In another embodiment, the second reset active region AR2 and the second driving active region AD2 may be P-type doped regions and may have N-type channels. That is, the second reset transistor RX2, the second driving transistor DX2, and the second selecting transistor SX2 may be N-type conductors.

Referring again to FIGS. 2 and 5A, the first reset active region AR1 of the first transistor group TRG1 may be electrically connected to the first floating diffusion region FD1 and the third floating diffusion region FD3, and the second reset active region AR2 of the second transistor group TRG2 may be electrically connected to the second floating diffusion region FD2 and the fourth floating diffusion region FD4. In another embodiment, the first reset active area AR1 of the first transistor group TRG1 may be electrically connected to the second floating diffusion region FD2 and the fourth floating diffusion region FD4, and the second reset active region AR2 of the second transistor group TRG2 may be electrically connected to the first floating diffusion region FD1 and the third floating diffusion region FD3.

Specifically, when the first doped bulk region B1, the first transfer gate TG1, the first floating diffusion region FD1 of the first photodiode PD1, the third doped bulk region B3, the third transfer gate TG3, and the third floating diffusion region FD3 of the third photodiode PD3 have an N-type polarity, the first floating diffusion region FD1 and the third floating diffusion region FD3 may be electrically connected to the first reset active region AR1 in which the first reset transistor RX1 having the N-type conductor is disposed. When the second doped bulk region B2, the second transfer gate TG2, the second floating diffusion region FD2 of the second photodiode PD2, the fourth bulk diffusion region B4, the fourth transfer gate TG4, and the fourth floating diffusion region FD4 of the fourth photodiode PD4 have a P-type polarity, the second floating diffusion region FD2 and the fourth floating diffusion region FD4 may be electrically connected to the second reset active area AR2 in which the second reset transistor RX2 having the P-type conductor is disposed.

Figure 5C:
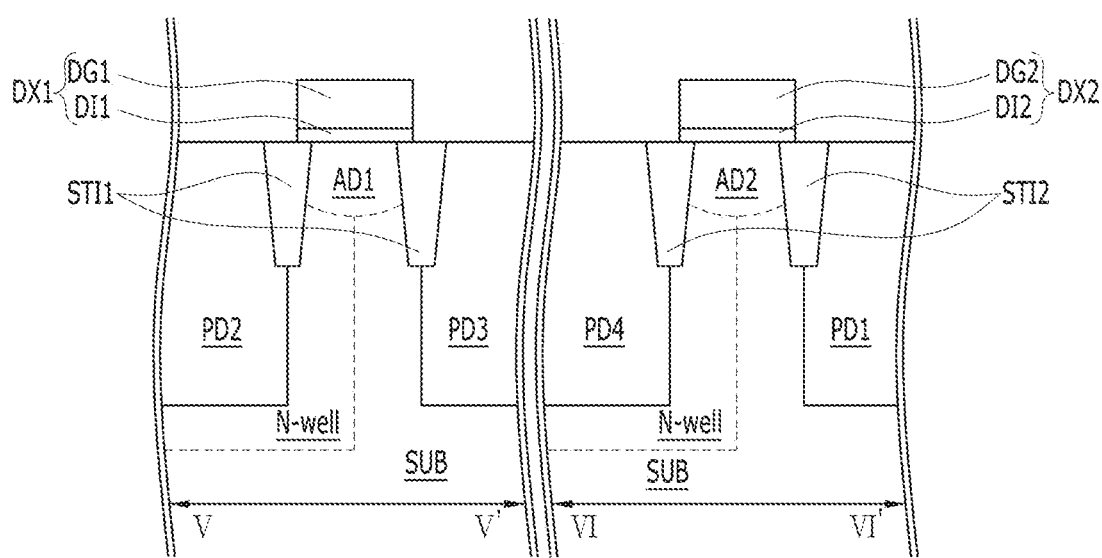
FIG. 5C is a cross-sectional view of portions of an example of a pixel block taken along lines V-V' and VI-VI' shown in FIG. 5B.

FIG. 5C is a cross-sectional view of portions of an example of a pixel block 815 taken along lines V-V' and VI-VI' shown in FIG. 5B. Referring to FIG. 5C, the first driving active area AD1 may be defined by the first shallow trench isolation area STI1 in the substrate SUB, and the second driving active area AD2 may be defined by the second shallow trench isolation area STI2 in the substrate SUB.

The first driving transistor DX1 may be disposed on the first driving active area AD1. The first driving transistor DX1 may include a first driving transistor insulating layer DI1 in contact with the substrate SUB, on which the first driving transistor insulating layer DI1 is formed, and a first driving gate DG1, which is formed on the first driving transistor insulating layer DI1. The second driving transistor DX2 includes a second driving transistor insulating layer DI2 in contact with the substrate SUB, on which the second driving transistor insulating layer DI2 is formed, and a second driving gate DG2, which is formed on the second driving transistor insulating layer DI2.

As mentioned above, the first driving active region AD1 may be the P-type doped region, and the second driving active region AD2 may be the N-type doped region. Although not shown, the first reset active area AR1 may be defined by the first shallow trench isolation area STI1, and the second reset active area AR2 may be defined by the second shallow trench isolation area STI2. The first reset active region AR1 may be the P-type doped region, and the second reset active region AR2 may be the N-type doped region.

In the embodiment, the first photodiode PD1 and the third photodiode PD3 may be the N-type doped region, and the second photodiode PD2 and the fourth photodiode PD4 may be the P-type doped region surrounded by the N-well region. As mentioned above, the first to fourth photodiodes PD1 to PD4 may correspond to the first to fourth bulk regions B1 to B4, respectively.

Figure 6A:
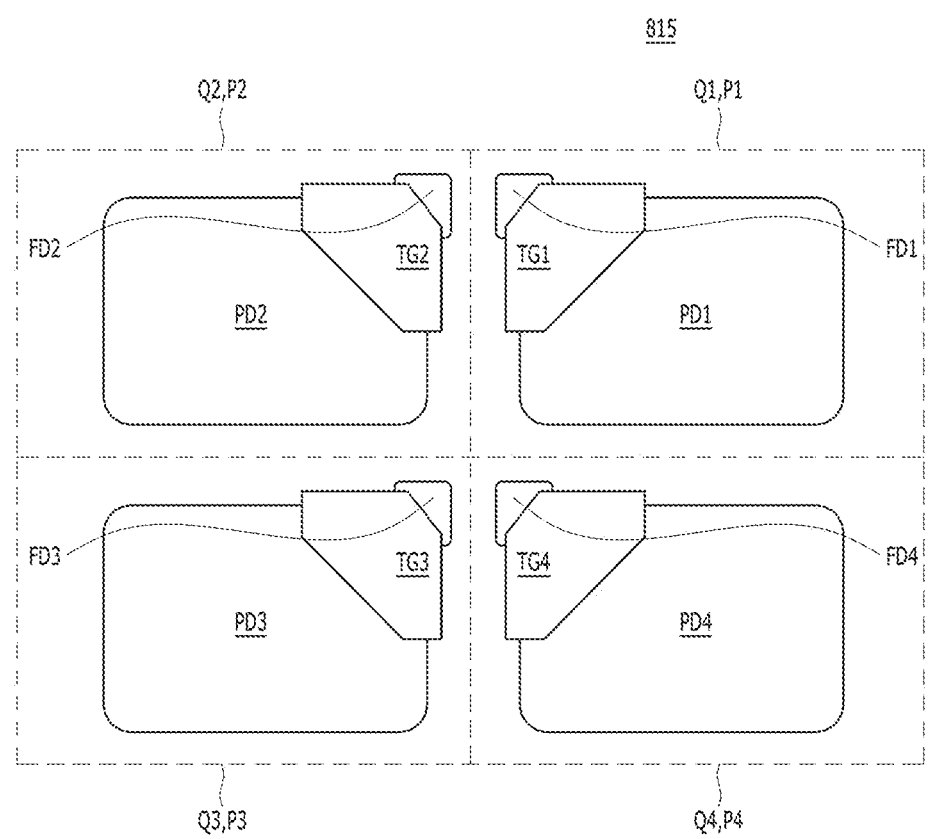
FIGS. 6A and 6B are top views schematically illustrating examples of pixel blocks of an image sensor based on an embodiment of the disclosed technology.
Figure 6B:
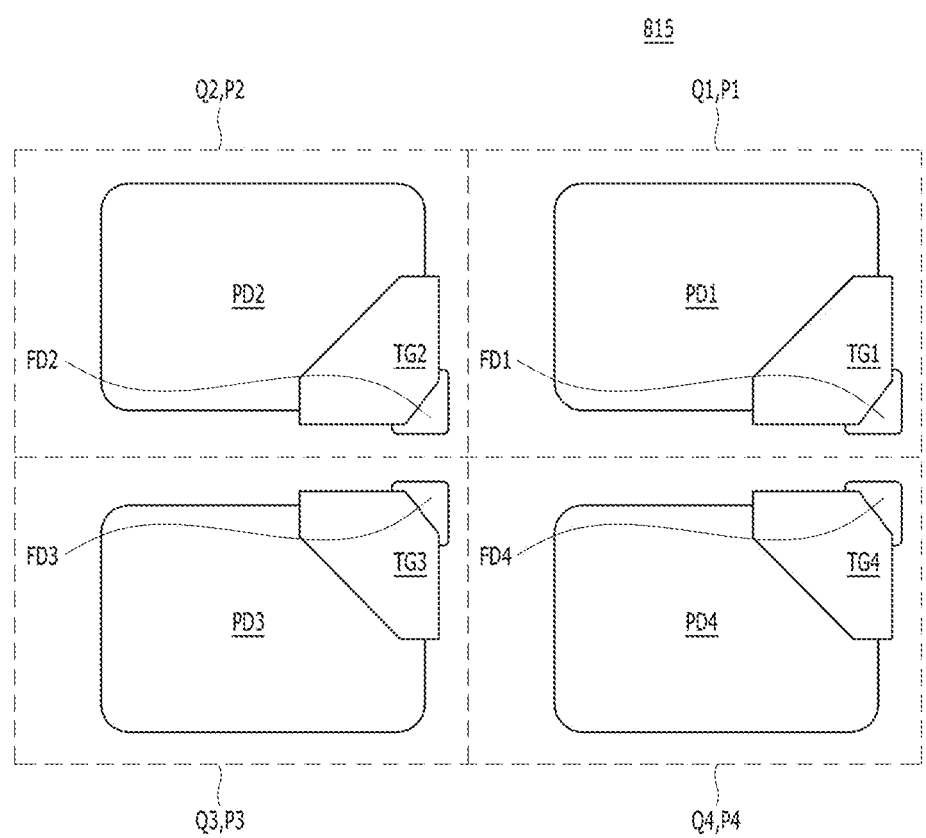

FIGS. 6A and 6B are top views schematically illustrating examples of pixel blocks 815 of an image sensor 800 based on an embodiment of the disclosed technology. Referring to FIG. 6A, a pixel block 815 of an image sensor 800 in accordance with an embodiment may include four unit pixels P1-P4 arranged in a matrix form. For example, the pixel block 815 may include the first to the fourth unit pixels P1 to P4 corresponding to first to fourth quadrants Q1 to Q4.

The first to fourth unit pixels P1 to P4 may include first to fourth photodiodes PD1 to PD4, first to fourth transfer gates TG1 to TG4, and first to fourth floating diffusion regions FD1-FD4, respectively. Provided that the pixel block 815 has two geometric centerlines extending perpendicularly from one another, the first to fourth photodiodes PD1 to PD4 of the pixel block 815 may be arranged such that the first to fourth transfer gates TG1 to TG4 and the first to fourth floating diffusion regions FD1 to FD4 may be symmetrical about one geometric centerline and asymmetrical about the other geometric centerline. That is, the first to fourth unit pixels P1 to P4 may be arranged in a symmetrical pattern. Specifically, the first and second unit pixels P1 and P2 may form a first pair, and the third and fourth unit pixels P3 and P4 may form a second pair.

The elements of the first unit pixel P1 and the elements of the third unit pixel P3 arranged in a diagonal direction extending from the bottom left corner to the upper right corner of the pixel block 815 may have the same polarity (e.g., the N-type polarity), and the elements of the second unit pixel P2 and the elements of the fourth unit pixel P4 arranged in a diagonal direction extending from the bottom right corner to the upper left corner of the pixel block 815 have the same polarity (e.g., the P-type polarity). Specifically, the first and third photodiodes PD1 and PD3, the first and third transfer gates TG1 and TG3, and the first and third floating diffusion regions FD1 and FD3 of the first and third unit pixels P1 and P3 may have the N-type polarity, and the second and fourth photodiodes PD2 and PD4, the second and fourth transfer gates TG2 and TG4, and the second and fourth floating diffusion regions FD2 and FD4 of the second and fourth unit pixels P2 and P4 may have the P-type polarity. The polarity of the pixel elements may be interchangeable.

Referring to FIG. 6B, a pixel block 815 of an image sensor 800 based on an embodiment of the disclosed technology may include four unit pixels P1 to P4 arranged in first to fourth quadrants Q1 to Q4, respectively, in a matrix form. The first to fourth unit pixels P1 to P4 may include first to fourth photodiodes PD1 to PD4, first to fourth transfer gates TG1 to TG4, and first to fourth floating diffusion regions FD1 to FD4, respectively.

Provided that the pixel block 815 has two geometric centerlines extending perpendicularly from one another, the first to fourth photodiodes PD1 to PD4 of the pixel block 815 may be arranged such that the first to fourth transfer gates TG1 to TG4 and the first to fourth floating diffusion regions FD1 to FD4 may be symmetrical about one geometric centerline and asymmetrical about the other geometric centerline. For example, the first to fourth unit pixels P1 to P4 may be arranged in a symmetrical pattern. Specifically, the first and fourth unit pixels P1 and P4 may form a first pair, and the second and third unit pixels P2 and P3 may form a second pair.

The elements of the first unit pixel P1 and the elements of the third unit pixel P3 arranged in a diagonal direction extending from the bottom left corner to the upper right corner of the pixel block 815 may have the same polarity (e.g., the N-type polarity), and the elements of the second unit pixel P2 and the elements of the fourth unit pixel P4 arranged in a diagonal direction extending from the bottom right corner to the upper left corner of the pixel block 815 may have the same polarity (e.g., the P-type polarity). Specifically, the first and third photodiodes PD1 and PD3, the first and third transfer gates TG1 and TG3, and the first and third floating diffusion regions FD1 and FD3 of the first and third unit pixels P1 and P3 may have the N-type polarity, and the second and fourth photodiodes PD2 and PD4, the second and fourth transfer gates TG2 and TG4, and the second and fourth floating diffusion regions FD2 and FD4 may have the P-type polarity. The polarity of the pixel elements may be interchangeable.

Figure 7A:
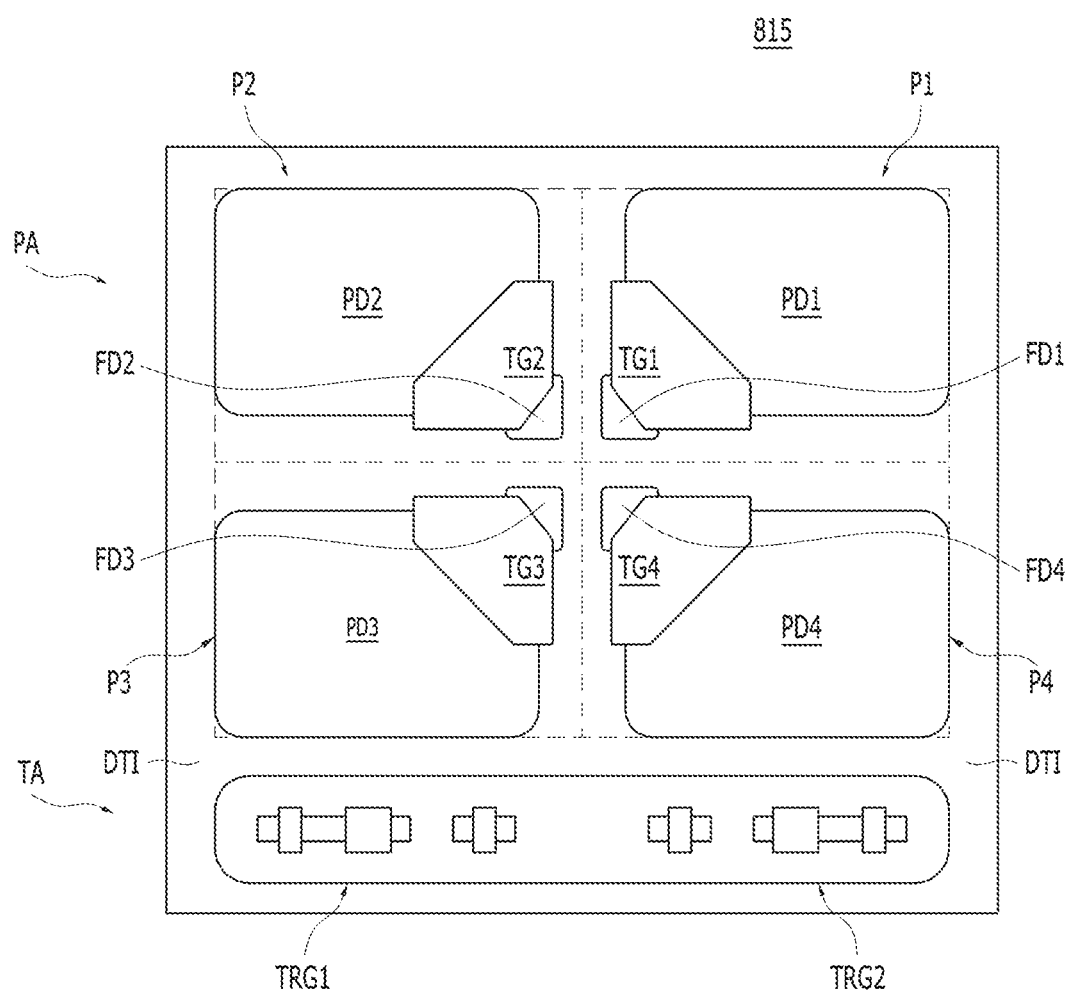
FIG. 7A is a top view schematically illustrating an example of a pixel block of an image sensor based on an embodiment of the disclosed technology.

FIG. 7A is a top view schematically illustrating an example of a pixel block 815 of an image sensor 800 based on an embodiment of the disclosed technology. Referring to 7A, a pixel block 815 of an image sensor 800 implemented based on an example of the disclosed technology may include a pixel area PA and a transistor area TA separated and/or surrounded by a deep trench isolation region DTI. Structures and arrangements of the first to fourth unit pixels P1 to P4 in the pixel area PA can be understood with reference to FIG. 3.

Figure 7B:
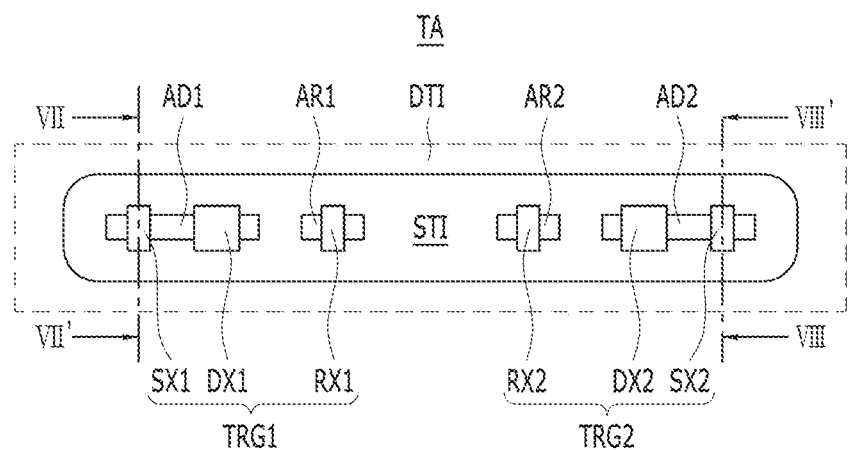
FIG. 7B is an enlarged top view illustrating an example of a transistor region based on an embodiment of the disclosed technology.

FIG. 7B is an enlarged top view illustrating an example of the transistor region TA based on an embodiment of the disclosed technology. Referring to FIG. 7B, the first transistor group TRG1 and the second transistor group TRG2 may be disposed in the transistor region TA. The first transistor group TRG1 may include a first reset active region AR1 and a first driving active region AD1 defined by a shallow trench isolation region STI. The first transistor group TRG1 may include a first reset transistor RX1 on the first reset active area AR1, and a first driving transistor DX1 and a first selecting transistor SX1 on the first driving active area AD1. In some embodiments, the first reset active region AR1 and the first driving active region AD1 may be P-type doped regions and may have N-type channels. The first reset transistor RX1, the first driving transistor DX1, and the first selecting transistor SX1 may be N-type conductors. In another embodiment, the first reset active region AR1 and the first driving active region AD1 may be N-type doped regions and may have P-type channels. Therefore, the first reset transistor RX1, the first driving transistor DX1, and the first selecting transistor SX1 may be P-type conductors.

The second transistor group TRG2 may include a second reset active region AR2 and a second driving active region AD2 defined by the shallow trench isolation region STI. The second transistor group TRG2 may include a second reset transistor RX2 on the second reset active area AR2, and a second driving transistor DX2 and a second selecting transistor SX2 on the second driving active area AD2. In an embodiment, the second reset active region AR2 and the second driving active region AD2 may be N-type doped regions and may have P-type channels. The second reset transistor RX2, the second driving transistor DX2, and the second selecting transistor SX2 may have P-type conductors. In another embodiment, the second reset active region AR2 and the second driving active region AD2 may be P-type doped regions and may have N-type channels. Therefore, the second reset transistor RX2, the second driving transistor DX2, and the second selecting transistor SX2 may have N-type conductors.

Figure 7C:
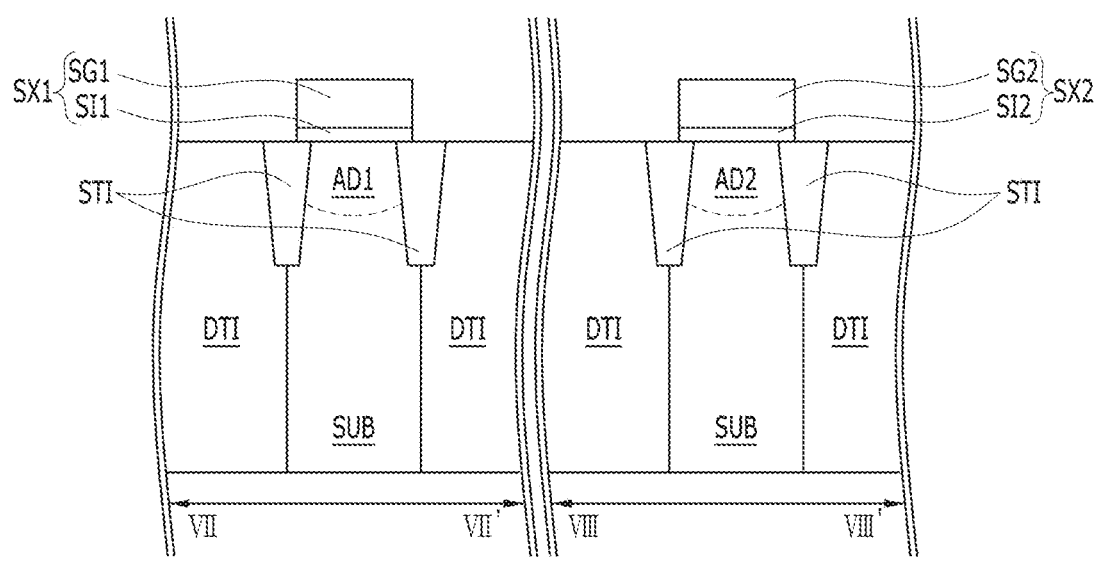
FIG. 7C is a cross-sectional view of portions of an example of the transistor region taken along lines VII-VII' and VIII-VIII' shown in FIG. 7B.

FIG. 7C is a cross-sectional view of portions of an example of the transistor region TA taken along lines VII-VII' and VIII-VIII' shown in FIG. 7B. Referring to FIG. 7C, the first driving active area AD1 and the second driving active area AD2 may be defined by the shallow trench isolation region STI formed in the transistor area TA. The transistor area TA may be defined by the deep trench isolation area DTI in the substrate SUB. The first selecting transistor SX1 may be disposed on the first driving active area AD1. The first selecting transistor SX1 may include a first selecting transistor insulating layer SI1 in contact with the substrate SUB and a first selecting gate SG1 on the first selecting transistor insulating layer SI1, and the second selecting transistor SX2 may include a second selecting transistor insulating layer SI2 in contact with the substrate SUB and a second selecting gate SG2 on the second selecting transistor insulating layer SI2.

The first driving active region AD1 may be a P-type doped region, and the second driving active region AD2 may be an N-type doped region. Although not shown, the first reset active area AR1 may be also defined by the shallow trench isolation area STI, and the second reset active area AR2 may be also defined by the shallow trench isolation area STI. The first reset active region AR1 may be a P-type doped region, and the second reset active region AR2 may be an N-type doped region.

In another example embodiment of the disclosed technology, while the pixel block 815 of the image sensor 800 may include four unit pixels P1-P4 arranged in a matrix form, elements of the unit pixels P1-P4 on the same row may be arrayed to have a first type, and elements of the unit pixels P1-P4 on the same column may be arrayed to have a second type. Specifically, the first and second photodiodes PD1 and PD2, the first and second transfer gates TG1 and TG2, and the first and second floating diffusion regions FD1 and FD2 arrayed on a first row may be the first type, and the third and fourth photodiodes PD3 and PD4, the third and fourth transfer gates TG3 and TG4, and the third and fourth floating diffusion regions FD3 and FD4 arrayed on a second row may be the second type. That is, the same type elements may be arrayed on a row direction adjacent to each other, and the different type elements may be arrayed on a column direction adjacent to each other. For example, when the first type is the N-type, the second type is the P-type. Alternatively, when the first type is the P-type, the second type is the N-type.

In another example embodiment of the disclosed technology, while the pixel block 815 of the image sensor 800 may include four unit pixels P1-P4 arranged in a matrix form, elements of the unit pixels P1-P4 on the same column may be arrayed to have a first type, and elements of the unit pixels P1-P4 on the same row may be arrayed to have a second type. Specifically, the first and fourth photodiodes PD1 and PD4, the first and fourth transfer gates TG1 and TG4, and the first and fourth floating diffusion regions FD1 and FD4 arrayed on a first column may be the first type, and the second and third photodiodes PD2 and PD3, the second and third transfer gates TG2 and TG3, and the second and third floating diffusion regions FD2 and FD3 arrayed on a second column may be the second type. That is, the same type elements may be arrayed on the column direction adjacent to each other, and the different type elements may be arrayed on the row direction adjacent to each other. For example, when the first type is the N-type, the second type is the P-type. Alternatively, when the first type is the P-type, the second type is the N-type.

In another example embodiment of the disclosed technology, while the pixel block 815 of the image sensor 800 may include four unit pixels P1-P4 arranged in a matrix form, one of the four unit pixels P1-P4 may have the first type and the other three of the four unit pixels P1-P4 may have the second type.

In the three example embodiments of the disclosed technology as above, the unit pixels P1-P4 being adjacent to each other on the row direction or the column direction may be alternatingly arrayed in a mirrored form.

Figure 8:
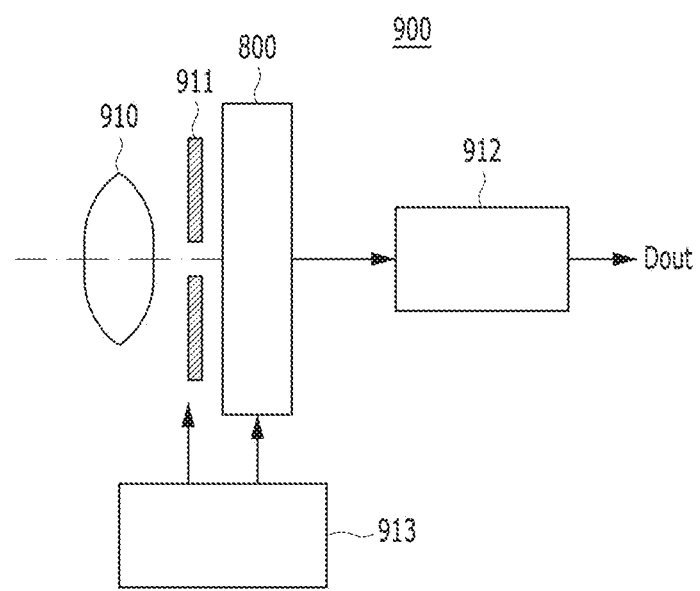
FIG. 8 is a diagram illustrating an example of an electronic device including at least one image sensor based on various embodiments of the disclosed technology.

FIG. 8 is a diagram illustrating an example of an electronic device including an image sensor based on an embodiment of the disclosed technology. Referring to FIG. 8, the electronic device 900 including the image sensor 800 implemented based on the disclosed technology may include a camera capable of capturing a still image or a moving image. The electronic device 900 may include the image sensor 800, an optical system 910 (or an optical lens), a shutter unit 911, a controller 913 for controlling/driving the shutter unit 911, and a signal processor 912. The optical system 910 may guide optical image of a subject to a pixel array (e.g., "810" of FIG. 1) of the image sensor 800. The optical system 910 may include a plurality of optical lenses. The shutter unit 911 may control the length of time for exposing the image sensor 800 to light and shutting it off. The controller 913 may control a transfer operation of the image sensor 800 and a shutter operation of the shutter unit 911. The signal processor 912 may process diverse kinds of signals outputted from the image sensor 800. Image signals Dout may be outputted from the signal processor 912 after the signal processing may be stored in a storage medium (not shown), such as a memory, or outputted to a monitor (not shown).

According to the embodiments, since the photodiodes are arranged such that the N-type photodiodes and the P-type photodiodes are adjacent to one another, unwanted interpixel influences can be decreased. Specifically, the N-type carriers (e.g., electrons) generated in the N-type doped regions (e.g., N-type photodiodes) and the P-type carries (e.g., holes) generated in the P-type doped regions (e.g., P-type photodiodes) will be less likely to influence one another because of potential barriers (e.g., depletion regions) between the N-type doped regions and the P-type doped regions. Accordingly, a blooming effect and a cross-talk effect can be suppressed, and optical sensitivities and quantum efficiency of unit pixels can be improved.

According to the embodiments, an implantation process and/or a deep trench isolation formation process for optical and electrical insulation between the unit pixels can be omitted and/or skipped. Accordingly, a dark current, a hot pixel effect, a dark shading effect, and etc. of the unit pixels of the image sensor can be decreased and suppressed. Furthermore, occupied sizes of the unit pixels of the image sensor can be downsized, and a resolution of the image sensor can be improved.

While the disclosed technology has been described with respect to the specific embodiments, the disclosed technology can be implemented in various ways beyond the specifics of the examples described herein.

What is claimed is:

1. An image sensor including a pixel block, the pixel block comprising:

a first unit pixel including a first photodiode, a first transfer gate, and a first floating diffusion region;

a second unit pixel including a second photodiode, a second transfer gate, and a second floating diffusion region;

a third unit pixel including a third photodiode, a third transfer gate, and a third floating diffusion region; and a fourth unit pixel including a fourth photodiode, a fourth transfer gate, and a fourth floating diffusion region, wherein:

the first photodiode of the first unit pixel and the third photodiode of the third unit pixel are N-type photodiodes;

the second photodiode of the second unit pixel and the fourth photodiode of the fourth unit pixel are P-type photodiodes; and the first, second, third and fourth unit pixels are spatially arranged so that at least two adjacent photodiodes are different types, and wherein the first to fourth unit pixels are arranged in first to fourth quadrants, respectively, the first unit pixel and the third unit pixel are arranged in a first diagonal direction, and the second unit pixel and the fourth unit pixel are arranged in a second diagonal direction crossing the first diagonal direction, wherein the pixel block further comprises:

an N-type driving transistor, an N-type selecting transistor, and an N-type reset transistor electrically connected to the first floating diffusion region and the third floating diffusion region, and a P-type driving transistor, a P-type selecting transistor, and a P-type reset transistor electrically connected to the second floating diffusion region and the fourth floating diffusion region.

2. The image sensor of claim 1, wherein the first to fourth transfer gates and the first to fourth floating diffusion regions are disposed to face a center portion of the pixel block.

3. The image sensor of claim 1, wherein:
the first transfer gate and the third transfer gate are N-type conductors, and
the second transfer gate and the fourth gate are P-type conductors.

4. The image sensor of claim 1, wherein:
the first floating diffusion region and the third floating diffusion region are N-type doped regions, and
the second floating diffusion region and the fourth diffusion are P-type doped regions.

5. The image sensor of claim 1, wherein:
the first photodiode comprises a first doped bulk region and a first doped surface region,
the second photodiode comprises a second doped bulk region and a second doped surface region,
the third photodiode comprises a third doped bulk region and a third doped surface region; and
the fourth photodiode comprises a fourth doped bulk region and a fourth doped surface region,
and wherein:
the first doped bulk region and the third doped bulk region are N-type doped regions, and
the second doped bulk region and the fourth doped bulk region are P-type regions.

6. The image sensor of claim 5, wherein:
the first doped surface region and the third doped surface region are P-type doped regions, and
the second doped surface region and the fourth doped surface region are N-type doped regions.

7. The image sensor of claim 1, wherein:
the first floating diffusion region and the third floating diffusion region are electrically connected to each other, and
the second floating diffusion region and the fourth floating diffusion region are electrically connected to each other.

8. The image sensor of claim 1, wherein the pixel block further comprises:
a P-type driving active region having the N-type driving transistor and the N-type selecting transistor formed therein,
a P-type reset active region having the N-type reset transistor formed therein,
an N-type driving active region having the P-type driving transistor and the P-type selecting transistor formed therein, and
an N-type reset active region having the P-type reset transistor formed therein.

9. An image sensor comprising:
a P-type substrate;
an N-well region formed in the P-type substrate;
a first N-type photodiode including a first N-type doped bulk region formed in the P-type substrate and a first P-type doped surface region on the first bulk doped region;
a first P-type photodiode including a first P-type doped bulk region formed in the N-well region and a first N-type doped surface region on the first P-type bulk doped region;
a first N-type transfer gate electrically connected to the first N-type photodiode and a first N-type floating diffusion region; and
a first P-type transfer gate electrically connected to the first P-type photodiode and a first P-type floating diffusion region.

10. The image sensor of claim 9, wherein the first N-type floating diffusion region and the first P-type floating diffusion region are disposed relatively closer than the first N-type transfer gate and the first P-type transfer gate.

11. The image sensor of claim 9, further comprising:
a second N-type photodiode including a second doped bulk region formed in the P-type substrate and a second P-type doped surface region on the second N-type bulk doped region;
a second P-type photodiode including a second doped bulk region formed in the N-well region in the substrate and a second N-type doped surface region on the second P-type bulk doped region;
a second N-type transfer gate electrically connected to the second N-type photodiode and a second N-type floating diffusion region; and
a second P-type transfer gate electrically connected to the second P-type photodiode formed in the N-well region and a second P-type floating diffusion region.

12. The image sensor of claim 9, further comprising:
an N-type active region; and
a P-type driving transistor, a P-type selecting transistor, and a P-type reset transistor on the N-type active region.

13. The image sensor of claim 12, wherein:
the N-type active region is an N-type doped region; and
the P-type driving transistor, the P-type selecting transistor, and the P-type reset transistor have P-type gate electrodes.

14. The image sensor of claim 12, further comprising:
a P-type active region; and an N-type driving transistor, an N-type selecting transistor, and an N-type reset transistor on the P-type active region.

15. The image sensor of claim 14, wherein:
the P-type active region is a P-type doped region; and
the N-type driving transistor, the N-type selecting transistor, and the N-type reset transistor have N-type gate electrodes.

16. The image sensor of claim 14, wherein:
the P-type active region, the N-type driving transistor, the N-type selecting transistor, and the N-type reset transistor are electrically connected to the first N-type floating diffusion region; and
the N-type active region, the P-type driving transistor, the P-type selecting transistor, and the P-type reset transistor are electrically connected to the first P-type floating diffusion region.

* * * * *